United States Patent
White

(10) Patent No.: US 10,980,145 B2
(45) Date of Patent: *Apr. 13, 2021

(54) HOT-PLUGGABLE CONNECTION FOR DATA COMMUNICATIONS

(71) Applicant: Vapor IO, Inc., Austin, TX (US)

(72) Inventor: Steven White, Austin, TX (US)

(73) Assignee: Vapor IO, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/726,577

(22) Filed: Dec. 24, 2019

(65) Prior Publication Data

US 2020/0245491 A1 Jul. 30, 2020

Related U.S. Application Data

(63) Continuation of application No. 15/338,402, filed on Oct. 30, 2016, now Pat. No. 10,555,435.

(Continued)

(51) Int. Cl.
| | |
|---|---|
| *G02B 6/42* | (2006.01) |
| *G06F 13/40* | (2006.01) |
| *H05K 7/14* | (2006.01) |
| *H01R 31/06* | (2006.01) |
| *H04Q 1/00* | (2006.01) |
| *H04Q 1/02* | (2006.01) |
| *G06F 11/07* | (2006.01) |
| *H01R 24/50* | (2011.01) |
| *H05K 5/02* | (2006.01) |

(Continued)

(52) U.S. Cl.
CPC ....... *H05K 7/1492* (2013.01); *G06F 11/0745* (2013.01); *G06F 11/0769* (2013.01); *H01R 24/50* (2013.01); *H01R 31/065* (2013.01); *H04Q 1/00* (2013.01); *H04Q 1/13* (2013.01); *H05K 5/026* (2013.01); *H05K 7/1489* (2013.01); *H05K 7/1494* (2013.01); *G06F 11/0754* (2013.01); *H01R 24/542* (2013.01); *H01R 24/64* (2013.01); *H01R 2103/00* (2013.01); *H01R 2107/00* (2013.01)

(58) Field of Classification Search
None
See application file for complete search history.

(56) References Cited

U.S. PATENT DOCUMENTS

| | | | | |
|---|---|---|---|---|
| 7,573,715 B2 | 8/2009 | Mojaver | | |
| 8,083,417 B2 * | 12/2011 | Aronson | ............... | G02B 6/3817 385/92 |

(Continued)

OTHER PUBLICATIONS

Notice of Allowance in U.S. Appl. No. 15/165,590 dated Apr. 22, 2020 (9 pages).

(Continued)

*Primary Examiner* — Hyun Nam
(74) *Attorney, Agent, or Firm* — Pillsbury Winthrop Shaw Pittman, LLP

(57) ABSTRACT

Provided is a patch panel, comprising: a circuit board; and an SFP, SFP+, or QSFP+ connector connected to a plurality of radio frequency coaxial (RF coaxial) connections via conductive traces of the circuit board, the RF coaxial connections configured to extend functionality of the SFP, SFP+, or QSFP+ socket of a computing device coupled to the patch panel from a rear end of the computing device to a front end of the computing device.

28 Claims, 5 Drawing Sheets

Related U.S. Application Data

(60) Provisional application No. 62/275,909, filed on Jan. 7, 2016, provisional application No. 62/262,477, filed on Dec. 3, 2015, provisional application No. 62/248,788, filed on Oct. 30, 2015.

(51) Int. Cl.
*H01R 24/54* (2011.01)
*H01R 24/64* (2011.01)
*H01R 103/00* (2006.01)
*H01R 107/00* (2006.01)

(56) References Cited

U.S. PATENT DOCUMENTS

| | | | |
|---|---|---|---|
| 8,438,893 B2 | 5/2013 | Durney | |
| 8,509,101 B2* | 8/2013 | Hilton | H04B 10/40 370/252 |
| 2011/0088096 A1* | 4/2011 | Hilton | H04L 9/0819 726/26 |
| 2011/0191632 A1* | 8/2011 | Miller | G06F 11/28 714/27 |
| 2012/0087656 A1* | 4/2012 | Rourke | H04L 12/4616 398/43 |
| 2012/0111817 A1 | 5/2012 | Sweeny | |
| 2013/0107450 A1 | 5/2013 | Zhang | |
| 2014/0268528 A1 | 9/2014 | Mick | |
| 2015/0090679 A1* | 4/2015 | Obernesser | A47B 47/0083 211/26 |
| 2016/0329689 A1* | 11/2016 | Yi | H05K 7/1492 |

OTHER PUBLICATIONS

Notice of Allowance in U.S. Appl. No. 15/165,590 dated Mar. 24, 2020 (9 pages).
Non-Final Office Action in related U.S. Appl. No. 16/937,490 dated Oct. 6, 2020 (7 pages).

* cited by examiner

HOT-PLUGGABLE CONNECTION FOR DATA COMMUNICATIONS

CROSS-REFERENCE TO RELATED APPLICATIONS

The present application is a continuation of U.S. Non-Provisional patent application Ser. No. 15/338,402 filed 30 Oct. 2016 which claims the benefit of the following U.S. Provisional Patent Applications: U.S. 62/248,788, filed 30 Oct. 2015; U.S. 62/262,477, filed 3 Dec. 2015; and U.S. 62/275,909, filed 7 Jan. 2016. The entire content of each parent application is incorporated by reference in its entirety.

BACKGROUND

1. Field

The present disclosure relates generally to computing equipment and, more specifically to hot-pluggable connections for data communications.

2. Description of the Related Art

Recently, the data center industry has begun moving towards high speed data transmission (e.g., 10 Gbs, 40 Gbs, and 100 Gbs). This is causing problems with a subset of the cabling used in data centers. Cables connected to patch panels are often used to route signals over short distances (e.g., one or two meters), often between high-spatial-density arrays of connectors, with the signal being delivered to at least one female cable receptacle at a different location from where the panel receives the signal.

Traditionally, patch panels often used RJ45 connections and corresponding cables for this purpose. But RJ45 cables often do no support these newer, faster data rates without expensive and cumbersome duplication of cabling to provide parallel data paths.

Other cables can support faster data rates, but those conventional implementations of those cables are often not suitable for use in patch panels. SFP (small form factor pluggable) SFP+, and QSFP+ (quad small form factor pluggable) cables can support these rates in many cases. But such network cabling generally does not have a patch panel equivalent to RJ45 patch panels, to extend an SFP, SFP+, or a QSFP+ socket to an alternate location. For example, for a RJ45, just a jack and plug may be needed to provide an extension, unlike SFP, SFP+, and QSFP+ network cabling. Further, in many cases, SFP, SFP+, and QSFP+ cables only provide male-to-male connections, making it difficult to spatially re-position female connections, like with a patch panel (which may be a single wired connection that performs such a re-positioning or an array of such connections). Accordingly, there is a need for a SFP, SFP+, and QSFP+ patch panels and related cabling.

SUMMARY

The following is a non-exhaustive listing of some aspects of the present techniques. These and other aspects are described in the following disclosure.

Some aspects include a patch panel, comprising: a circuit board; and an SFP, SFP+, or QSFP+ connector connected to a plurality of conductors, the connections being configured to extend functionality of the SFP, SFP+, or QSFP+ socket of a computing device coupled to the patch panel from a rear end of the computing device to a front end of the computing device, or vice versa.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
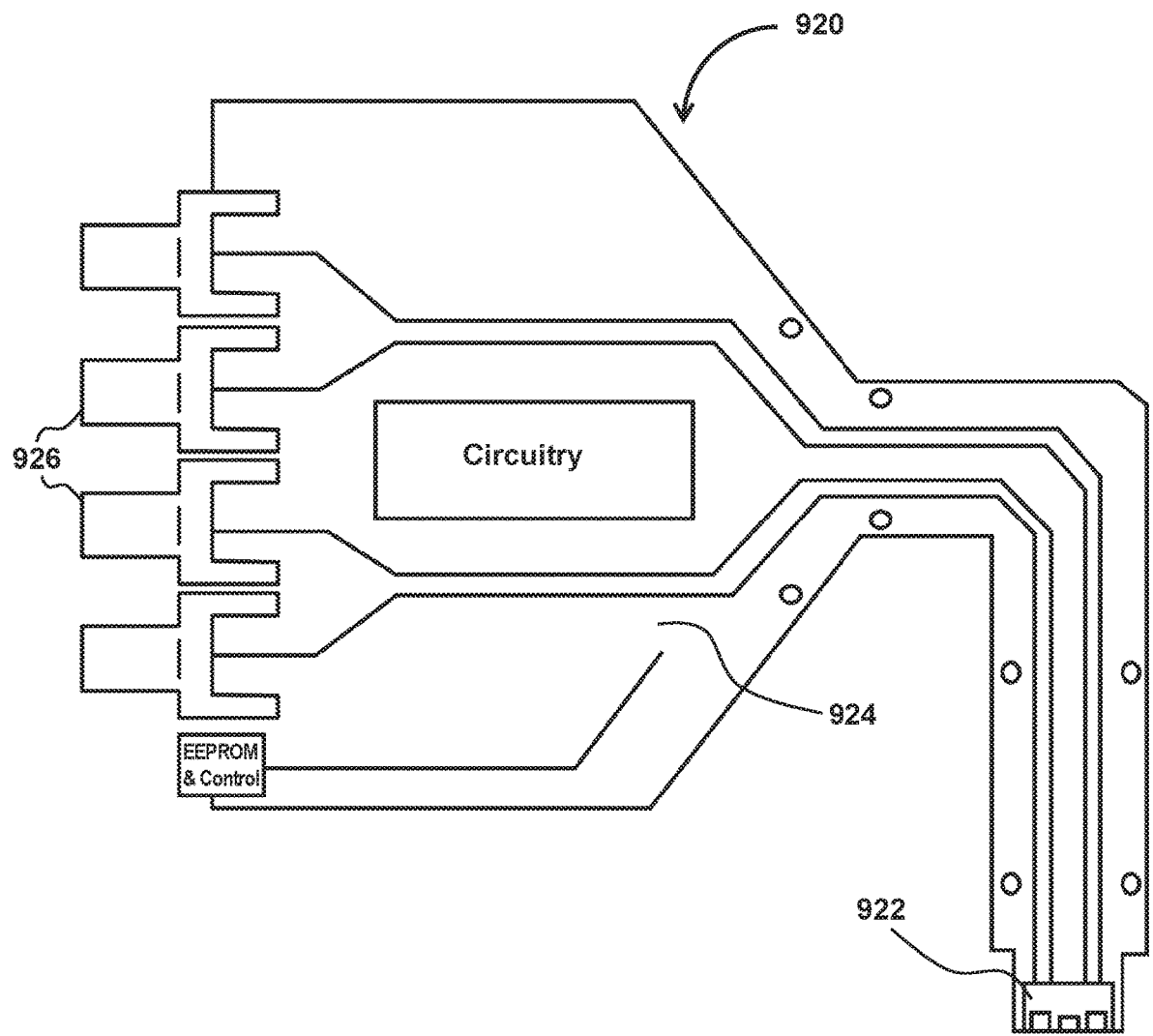
FIG. 1 illustrates an example of a passive patch panel for (or formed by) SFP/SFP+/QSFP+ cables, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center equipment design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Some of the above-mentioned issues (and others discussed below and that will be apparent to those of skill in the art) may be addressed with an SFP, SFP+, or QSFP+ passive patch panel illustrated in FIGS. 1 and 2. Some embodiments may create a male-to-female extension from an existing SFP, SFP+, or QSFP+ socket, e.g., on the back of a computing device, like a rack-mounted server in a data center. Such connections are expected to be particularly useful for those wishing to transfer computer interfaces from the rear of computing equipment to the front of computing equipment. In some cases, it is undesirable to place technicians in the rear region of some types of rack-mounted computing equipment, as some designs include exposed conductive bus bars that would be undesirable for a human user to touch when attempting service the computing device. Further, in some cases, it is desirable to optimize the airflow in a hot-aisle or central chamber of rack mounted computing equipment for fluid flow, without constraints imposed by the need for providing access to a technician to the space. (That said, embodiments are also consistent with use cases in which technicians access computing equipment from the rear.)

In some cases, the extension may be used for providing an alternative mounting location (e.g., for receiving a male connector of another cable) for the existing socket on a computing device. In some embodiments, the SFP, SFP+, or QSFP+ (SFP/SFP+/QSFP+) passive patch panel may facilitate relatively high speed networking that is normally on a rear end of a server to a front end of the server and expose same socket on the front as is on the back of server. In some embodiments, the SFP, SFP+, or QSFP+ passive patch panel may be configured for SFP/SFP+/QSFP+ cabling and networking for a functionally transparent connection between devices. In some instances, the SFP/SFP+/QSFP+ passive patch panel may extend connectivity within a given rack (e.g., between rack units), between racks, or from a rack to a connection outside of the rack.

In some embodiments, the SFP, SFP+, or QSFP+ passive patch panel may route signals between a rear and front of a 19" server adapter for an Open Compute Project (OCP) Open Rack design, described in U.S. patent application Ser. No. 15/165,590, titled Adapters for Rack-Mounted Computing Equipment, the contents of which are hereby incorporated by reference. A high port count patch panel may be created to simplify rack wiring (for example multiple units totaling 24, 48, or more ports). Data pins and communication signals may be passed on directly to the other side using the extension. In some cases, the SFP, SFP+, or QSFP+ patch panel may be a passive connection (e.g., without a digital processor) that serves as an extension from the back of the server to the front of channel. In some embodiments, e.g., when used with the 19" adaptor, the extension may be from the back of the chassis to the front of the chassis.

Some embodiments of the SFP/SFP+/QSFP+ passive patch panel (and related cabling, which may be used independently) are expected to support signaling over relatively short distances (for example, the extension may add between about 18 to 20 inches of copper routing the signal path) relative to signals passed through a top-of-rack switch and a data center network, which is expected to help preserve signal integrity in that without using active circuitry. In some embodiments, the cable may be entirely or substantially passive, which may be economically advantageous. For instance, other than passive impedance balancing, to give the signal what it needs to get from one end to the other, the printed circuit board (PCB) board may be a four or fewer layer board without active circuitry, which is expected to offer relatively low manufacturing costs. It should be noted though, that several inventions are described, and these independently useful. As such, not all embodiments provide all of these advantages. The impedance balancing may be based on the connectors, the wiring and the PCB board layout.

FIG. 1 illustrates an example of an SFP, SFP+, or (e.g., one or the other or a combination) QSFP+ passive patch panel 920. In some embodiments, SFP/SFP+/QSFP+ passive patch panel 920 includes an SFP, SFP+, or QSFP+ connector 922 connected to a plurality of radio frequency coaxial (RF coaxial) connections 926 via a circuit board 924. In some embodiments, SFP/SFP+/QSFP+ passive patch panel 920 may create an extension from an existing SFP/SFP+/QSFP+ socket of a computing device connected to connector 922. In some cases, the extension may be used for providing an alternative mounting location for the existing socket. In some embodiments, the SFP/SFP+/QSFP+ passive patch panel may extend high speed networking from the rear of the computing device to a front end of the computing device and expose same socket on the front as is on the back of the computing device.

In some embodiments, SFP, SFP+, or QSFP+ patch panel 920 may improve cable management relative to conventional techniques, offer easy connection and access to different devices (for example on a server rack), and easy maintenance of the cable system. In some cases the patch panel is hot-pluggable, supporting changing of connections while a computing device is operating. In operation, in cases where SFP, SFP+, or QSFP+ cables need to be removed, added, or replaced (sometimes multiple times), patch panel 920 may allow for an easier way for these types of cables to be organized in a way that prevents crosstalk or interference. In some cases, SFP/SFP+/QSFP+ passive patch panel 920 may connect and route data signals between computing devices, e.g., signals sent for monitoring, processing data, interconnecting, troubleshooting and testing in a more convenient manner. (Again, not all embodiments necessarily provide all of these benefits, which is not to suggest that any other feature is not also amenable to variation.)

In some embodiments, as shown in FIG. 1, patch panel 920 may have a first side that is narrow relative to a second side of the patch panel having circuit board 924 and connections 926. In some embodiments, the narrow side of the patch panel may have a size that is similar to that of standard SFP/SFP+/QSFP+ modules. That said, other configurations may be considered and are consistent with the present techniques, which is not to imply that other features may not also be varied. For example, the patch panel may have a rectangular or square shape. In some embodiments, patch panel 920 may be over molded with a resilient, insulative material (e.g., nylon, Teflon™, or glass epoxy).

In some embodiments, connector 922 interfaces between a computing device (e.g., a switch, router, media converter, firewalls, network interface cards, or other computing devices) and networking cables or other devices via patch panel 920. In some cases, connector 922 connects to an SFP socket in the computing device (e.g., a SFP, SFP+, or QSFP+ socket). For example, with a circuit that connects with an SFP/SFP+/QSFP+ connector in the computing device. The circuit may include a microcontroller and an SFP (e.g., SFP, SFP+, or QSFP+) transceiver to provide the interface. In some cases, the transceiver of connector 922 may be an optical transceiver that supports real time monitoring functions (e.g., digital diagnostics monitoring (DDM) or digital optical monitoring (DOM)). Parameters that may be monitored include optical output power, optical input power, temperature, laser bias current, or transceiver supply voltage. This is expected to be advantageous because of the flexibility (connectivity to different types of devices) of SFP transceivers and their low cost, though not all embodiments provide these benefits, which is not to suggest that other features may not also be varied. In cases, where the computing device does not have an SFP, SFP+, or QSFP+ socket an active electronic adapter may be used.

In operation, in some cases, the transceiver of connector 922 may digitize analog readings indicative of operation and write the digital values to corresponding designated memory addresses. Examples of the types of values in the transceiver EEPROM registers that may be read or written by the microcontroller include the following: serial ID, vendor specific identifier values, alarms and warning thresholds, calibration constants, diagnostic values, password values, and control function codes. Among other parameters, transceiver temperature, supply voltage, transmit bias current, transmit output power, receiver optical power and the like may be sensed, digitized, and written to EEPROM registers accessible to the microcontroller, which may monitor these values, compare them to thresholds, and transmit alarms in the event that thresholds are exceeded. In some case, in response to a jumper or remote control setting being in a particular configuration (like, 1×40 Gbps or 4×10 Gbps connections), corresponding values in the EEPROM registers may be written.

Connector 922 may support various communications standards (e.g., SONET, gigabit Ethernet, Fibre Channel, and other communications standards). In some cases, connector 922 may exchange (e.g., send or receive) data at data rates up to 8 Gbit/s Fibre Channel, 16 Gbit/s Fibre Channel or 10 Gbit/s Ethernet. In some embodiments, connector 922 may exchange data at rates from 4×10 Gbit/s up to 4×28 Gbit/s in some cases. For example, connector 922 may include a 4×10QSFP+ transceiver and may have four 10 Gbit/sec channels carrying 10 Gigabit Ethernet, 10 Gbit/s Fibre Channel, or QDR InfiniBand. In some embodiments, the four channels can also be combined into a single 40 Gigabit Ethernet link. In some embodiments, connector 922 may include a 4×14 Gbit/sec QSFP+ transceiver, which may support FDR InfiniBand and SAS-3 networking communications. In some embodiments, connector 922 may include a 4×28 Gbit/sec QSFP+ transceiver may support 100 Gigabit Ethernet or EDR InfiniBand. In some embodiments, connector 922 may include a 4×28 Gbit/sec QSFP+ transceiver for direct-attach breakout cables to adapt a single 100 Gbit/s Ethernet port to four independent 25 Gbit/s Ethernet ports.

In some embodiments, connector 922 may be housed in a housing that is similar to the size factor of housings of SFP/SFP+/QSFP+ modules. In some cases, connector 922 may have a width approximately between 13 and 18.5 mm, a depth approximately between 56 and 78.5 mm, and a height approximately 8 and 9 mm. Connector 922 in some cases may have dimensions that fit existing physical designs for 24 and 48-port switches and modular linecards, e.g., to retrofit older equipment in newer racks.

In some embodiments, connector 922 is hot swappable, the use of patch panel 920 may preserve this functionality of connector 922. This is expected to allow for replacing, adding or removing devices without significant interruption to or shutdown of other devices. Generally hot-swapping devices may allow for repair, upgrade, and replacement of these devices without significant interruption to the rest of devices. For example, where configuration of a device connected to connector 922 needs to be changed, the device may be disconnected from connector 922 without significant interruption to its operations. In some cases, only devices that allow hot-swapping may be hot-swapped even if they are connected to the patch panel 920 through connector 922. In some cases, a device connected to connector 922 may need specific software to be able to be connected and disconnected without interruption.

In some embodiments, connector 922 may be a passive connector without a dedicated transceiver. A passive connector 922 may be advantageous because of low-power, low-cost and low-latency. In some embodiments, functionality of the transceiver, described above may be provided by circuit board 924. In some embodiments, analog components may terminate conductive traces to reduce impedance mismatches between the conductors and the transceivers, e.g., with a pair of resistors connected to a high or low voltage rails respective, and with the conductive trace connected in series between the resistors.

In some embodiments, board 924 is configured to relay signals from connector 922 to connections 926. Board 924 may include circuitry (including one or more transceivers, one or more microcontrollers, memory, etc.) In some embodiments, board 924 may provide passive connection between connector 922 and RF coaxial connections 926, for example, via a plurality of passive conductive traces. In some embodiments, board 924 may include a microcontroller configured to perform some functionality traditionally provided by network switches connected to SFP/SFP+/QSFP+ cables. In some embodiments, when the network connections are copper cables, the circuit board 924 may include copper to copper transceivers. In some cases, when the network connections are fiber optic connections, the circuit board 924 may include fiber optic transceivers to preserve the connection status and fault signals that are on the cable head of the fiber optic connections.

In some embodiments, a microcontroller of board 924 may have a microcontroller 908 and may configure the SFP/SFP+/QSFP+ connector 922 responsive to various signals. For instance, a remote command, such as from a system administrator operative a computing device over a network, may instruct the microcontroller to implement or verify a particular configuration. In another example, jumpers or switches on board 922 may specify a configuration to the microcontroller, which may take responsive action. In some cases, commands may be mediated by a rack control unit like that described in the documents incorporated by reference, e.g., via commands sent over a direct current (DC) powerline modem.

In some embodiments, the microcontroller is operative to query and command a digital diagnostic monitoring interface (DDMI) of transceivers forming the connections, such as optical transceivers. In some cases, the microcontroller 908 may poll device operating parameters, alarms, and warning flags, and in response to detecting an alarm or flag, transmit a corresponding message (e.g., an interrupt or API request) to a rack controller or data center monitoring station. In some cases, the microcontroller may determine whether operating parameters are outside of a range, like a threshold range, and in response to exceeding the range, transmit an alert. In some cases, the transceiver may be accessed by the microcontroller via a two-wire bus using the I2C protocol. In some cases, the transceiver may have a memory map of 256-byte or more in an EEPROM at a specified address range, and the microcontroller may (e.g., periodically or in response to a remote command) retrieve values from this allocated memory to monitor the operation of transceivers. Further, in some cases, registers in this range may be written to reconfigure or monitor the transceiver.

In some embodiments, circuit board 924 may include a ground plane to reduce electrical noise, interference and to prevent crosstalk between adjacent circuit traces. For example, where multiple traces on the PCB are parallel electrical signals from the traces may be coupled to one another through electromagnetic induction. The ground plane layer may form a transmission line with the trace which helps confines most of the electromagnetic fields to the area near the trace and help prevent crosstalk. In some embodiments, a power plane may be used to distribute DC power to the active devices. In some cases, other than passive impedance balancing, to give the signal what it needs to get from one end to the other, the circuit board 924 may be a standard four-layer circuit board without active circuitry.

In some cases, circuit board 924 creates an optical signal from an electric signal received from the computing device port, and sending the optical signal along an optical fiber. Optical-electrical converters may be coupled with a transimpedance amplifier and a limiting amplifier to produce a digital signal in the electrical domain from the incoming optical signal, which may be attenuated and distorted while passing through the channel. Further signal processing such as clock recovery from data (CDR) performed by a phase-locked loop may also be applied before the data is passed on.

In some embodiments, circuitry of board 924 may be operative to be powered by power provided from SFP/SFP+/QSFP+ connector 922. For instance, in some embodiments, the circuitry is powered by a 3.3-volt power supply. In some cases, the power is delivered via a 12-volt DC power bus that also places the patch panel in communication with a rack controller. In some cases, the circuitry provides data indicative of configuration, alarms, sensor states, and the like, to other computing devices, like a rack-controller, for instance, via the DC power bus, $I^2C$, TTY, SMBus, or various other low-level communication protocols. Alternatively, or additionally, some embodiments may include an embedded processor on board 924 that exposes this data via higher-level protocols, like Ethernet, via an embedded network interface. In some cases, a rack-controller may change configurations of the patch panel and cause the patch panel to execute various commands via such forms of communication as well.

In some embodiments, connectors 926 are electrical connectors having a spatial separation for signaling and configured to work at various radio frequencies (e.g., in the multi-megahertz range). For example, connectors 926 may comprise coaxial radio frequency (RF) connectors configured to be used with coaxial cables and configured to maintain the shielding that the coaxial cables offer to provide passive impedance balancing. In some embodiments, connectors 926 may be plated with high-conductivity metals such as nickel, silver or gold. In some embodiments, connectors 926 may be spring loaded for a low ohmic electric contact and provide fastening via thread, bayonet, braces, or blind mating.

Figure 2:
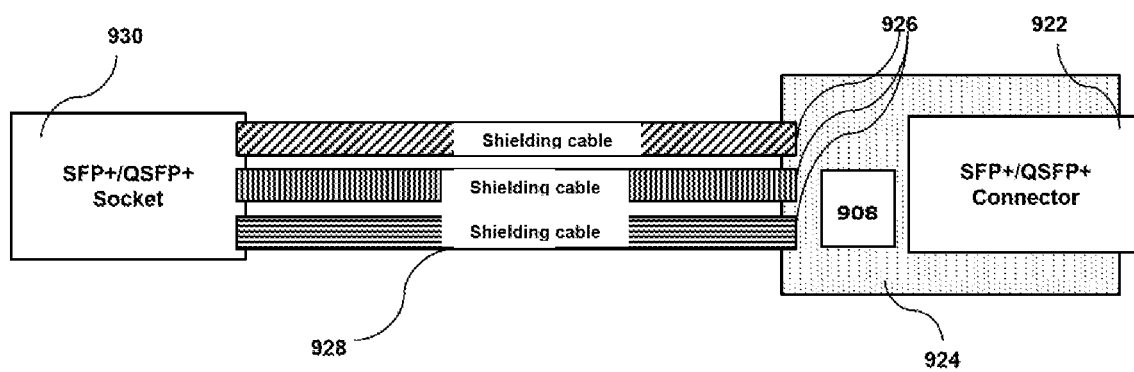
FIG. 2 illustrates a passive patch panel for (or formed by) SFP/SFP+/QSFP+ cables, in accordance with some embodiments.

In some embodiments, connectors 926 may comprise optical connectors configured to connect to optical fiber cables (e.g., cables 928 of FIG. 2). The use of optical fiber connectors may allow for a relatively high reliability, a low insertion loss and a high return loss.

In some embodiments, connectors 926 comprise at least one connector 926. In other cases, connectors 926 comprise more than one connector (e.g., two, three, four, or more). In the embodiments of FIGS. 1 and 2, connectors 926 comprise four connectors located towards a second end of circuit board 924. The second end is opposite to the first end horizontally when installed in a typical configuration. In some embodiments, two connectors 926 may be mounted towards the second end of circuit board 924 and two connectors may be mounted towards the middle of the circuit board, located on top of the circuit board. This is not to be considered limiting as the connectors 926 may be mounted at various locations on the circuit board including top and bottom of the circuit board, which is not to imply that any other feature is limiting. In some embodiments, circuit board 924 may have an angle (e.g., acute, right, or obtuse) for easy connection, installation, and easy cable management (for example channeling of cables through the channel of the adaptor described in the applications referenced herein). For example, in some cases, circuit board 924 may have a 90-degree bend (e.g., within 20 degrees of 90 degrees) at various location on the circuit board (e.g., towards the first end, towards the middle, or towards the second end). For example, in some cases where circuit board 924 has an angle, some or all of the connectors may be mounted on the circuit board close to the angle, and some or all of the connectors may be mounted towards the second end of circuit board 924.

In some embodiments, cables 928 conduct data networking electrical signals from circuit board 924. FIG. 2 illustrates an example of cables 928 in accordance with embodiments of the present techniques. In some embodiments, cables 928 cables include, for example, two conductors for transmits and two for receive. In some embodiments, the shielded cables may be adapted back into a socket in the front (e.g., socket 930 described below). In some cases, in addition to data networking signals from receive and transmit, other signals may be extended from the rear to the front. For example, different faults and failures for the electronics in cable, and other low speed logic level signals that can be extended from the rear to the front.

In some cases, cables 928 comprise shielded cables having an inner conductor for carrying the signal, a shield for reducing electrical noise and electromagnetic radiation, and an insulating layer to provide spacing between the inner conductor and the shield. The inner conductor may be made out of copper, stranded copper, copper plated steel, or silver plated steel. The shield may be made of braided strands of copper (for a flexible cable), a non-braided spiral winding of copper tape, or a layer of conducting polymer. The insulating layer may be made out of a dielectric material that can be polarized by an applied electric field (e.g., solid plastic, foam plastic, or gas). In some embodiments, cables 928 comprise coaxial cables, twisted pair cables, twin-axial cables, or other shielded cables. In some embodiments, coaxial cables may be preferred because of their low cost, capability of carrying power as well as signals, and relatively low crosstalk between cables and nearby circuits. In some embodiments, cables 928 may include optical fiber cables. In some cases, optical fiber cables may be advantageous because of their high data-carrying capacity, their low signal loss, and their low crosstalk.

In some embodiments, cables 928 may be adapted back into a socket 930 in the front. FIG. 2 illustrates an example of socket 930 in accordance with embodiments of the present techniques. In some embodiments, socket 930 may be similar to the socket of the computing device connected to connector 922 described above. In some embodiments, socket 930 is an SFP socket (e.g., SFP/SFP+/QSFP+) that includes a transceiver and circuitry (that includes a PCB and a microcontroller). In some cases, socket 930 may include a signal amplifier to re-shape the received signal.

In some embodiments, socket 930 may be designed to support data rates up to 8 Gbit/s Fibre Channel, 16 Gbit/s Fibre Channel or 10 Gbit/s Ethernet. In some embodiments, socket 930 may be designed to support data rates from 4×10 Gbit/s up to 4×28 Gbit/s in some cases. For example, socket 930 may include a 4×10 QSFP+ transceiver which may support four 10 Gbit/sec channels carrying 10 Gigabit Ethernet, 10 Gbit/s Fibre Channel, or QDR InfiniBand (In some embodiments, the four channels can also be combined into a single 40 Gigabit Ethernet link). In some embodiments, socket 930 may include a 4×14 Gbit/sec QSFP+ transceiver which may support FDR InfiniBand and SAS-3 networking communications standards. In some embodiments, socket 930 may include a 4×28 Gbit/sec QSFP+ transceiver which may support 100 Gigabit Ethernet or EDR InfiniBand. In some cases, a 4×28 Gbit/sec QSFP+ transceiver may be used with direct-attach breakout cables to adapt a single 100 Gbit/s Ethernet port to four independent 25 Gbit/s Ethernet ports.

In some embodiments, socket 930 is hot swappable, the use of patch panel 920 may preserve hot swapping functionality of the computing device connected to connector 922. This is expected to allow for replacing, adding or removing devices without significant interruption to or shutdown of other devices. In some cases, only devices that allow hot-swapping may be hot-swapped even if they are connected to the patch panel 920 through socket 930. In some cases, a device connected to socket 930 may need specific software to be able to be connected and disconnected without interruption.

In some embodiments, patch panel 920 may include a plurality of circuit boards 924, each circuit board dedicated to a connector 922 and cable connectors 926, or in some embodiments, a single circuit board 924 may service a plurality of pairs of connector 922 and cable connectors 926. In some embodiments, the patch panel 920 includes one or more circuit boards 924 configured to connect a plurality of connectors 922 with cable connectors 926.

This form of connection (through an SFP, SFP+, or QSFP+ cable) may create a high speed backplane. This may allow use of the active transceivers inside the SFP, SFP+, or QSFP+ cable to compensate for loss over the long distance, which may be advantageous in some cases due to the lack of long unshielded runs of traces on the circuit board. That said, embodiments are not limited to systems that provide these benefits, as various independently useful techniques are described here, which is not to suggest that any other feature may not be omitted in some cases.

In some embodiments, a plurality of instances of the circuit 924 may be arranged in spaced relation (e.g., in two or more rows of more than 4 circuits each) to form a patch panel, which may be disposed in one of the racks described in the provisional patent applications incorporated by reference to implement the connectivity described therein, e.g., to form a transparent extension of functionality (e.g., input or output) of devices within a rack, between racks or to a connection outside of the rack. The SFP/SFP+/QSFP+ passive patch panel may allow for a more organized rack wiring, cable management, and faster connections to equipment, relative to systems using RJ45 connectors. That said, embodiments are not limited to systems that provide these benefits, as various independently useful techniques are described here, which is not to suggest that any other feature may not be omitted in some cases.

The figures are only examples, and it should be noted that the patch panel may include a plurality of SFP sockets, SFP+ sockets, or QSFP+ sockets, in some cases, arrayed next to one another in a panel configured to fit into a one or two "U"s of a rack. In some embodiments, the passive patch panel may include a plurality of socket rows. In some cases, one or more rows may have dedicated wiring at the rear of the patch panel to outputs (e.g., top socket rows). In some embodiments, one or more rows may have dedicated wiring to inputs (e.g., bottom socket rows).

In some embodiments, a computing device may be connected to the patch panels above in a rack. Examples of such rack include the Open Compute Project rack designs and those described in the U.S. Provisional Patent Applications incorporated by reference above. Examples of computing devices are described below with reference to FIG. 5.

Thus, some of the above-described embodiments may facilitate the use of computing equipment with rear-access connections in front-access server racks, for instance, where the rear of the server is not designed for a human to service the computing equipment, like in server racks in which the hot aisle or interior chamber does not provide a door or other form of access to a technician. In some cases, some of the above embodiments accomplish this with a cable, like in a patch panel, that has a male SFP, SFP+ or QSFP+ connector on one end and a female connector on the other, thereby providing a connection like that provided on the back of the computing equipment at a different location, for example in the front of the server rack.

Figure 3:
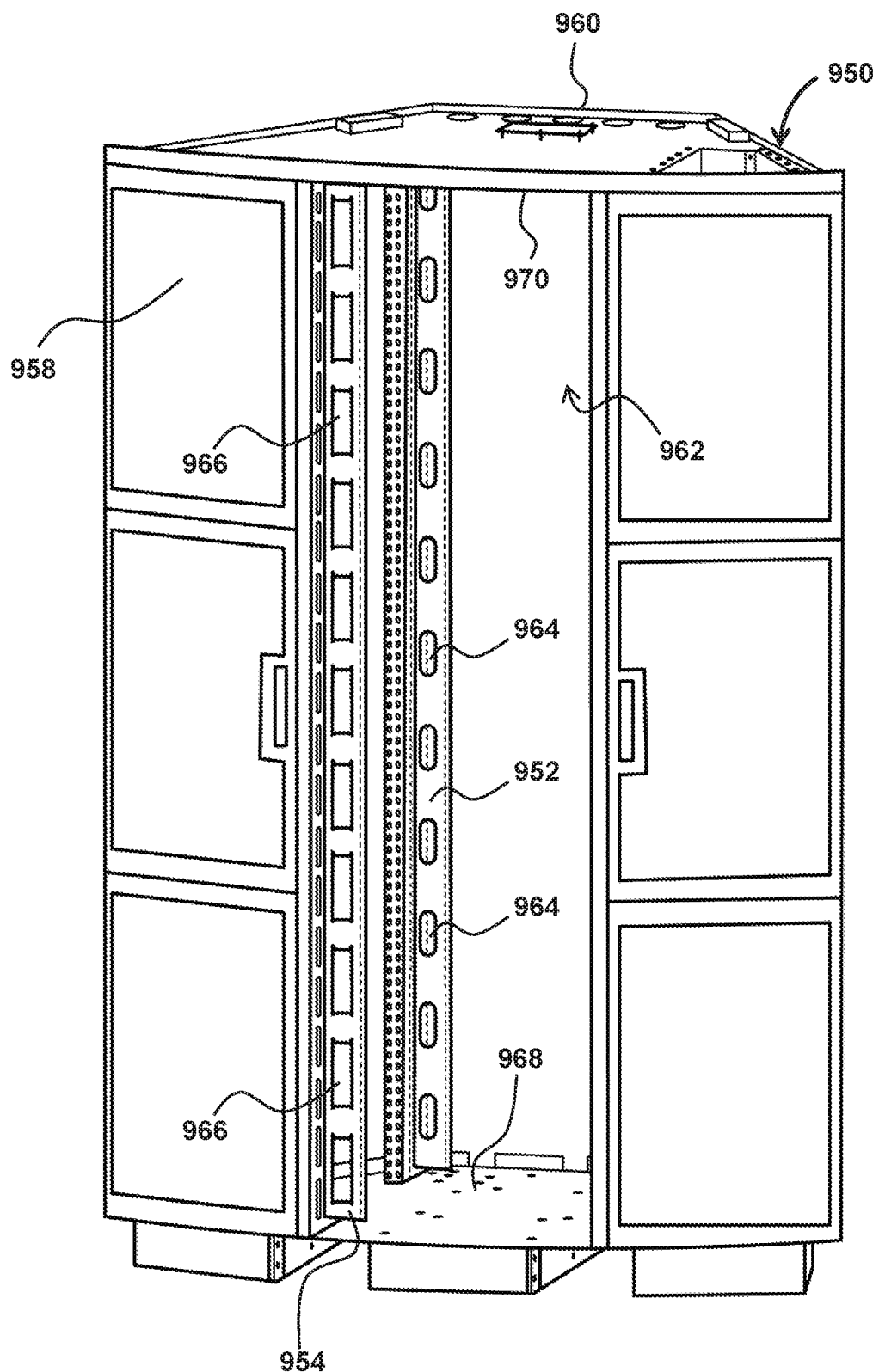
FIG. 3 is a perspective view of a rack configured to route cables from the rear of computing equipment to the front in accordance with some embodiments.

Such male-to-female cables are generally not available for each of SFP, SFP+, and QSFP+ cables. Rather than use (or in addition to using) new types of cables, other embodiments include a server rack 950 configured to use existing types of cabling to provide front-access to computing equipment connections in front-access server racks with computing equipment designed for rear access. The illustrated server rack 950 of FIG. 3, in some embodiments includes a rear and front support structure 952 and 954, respectively, that support cables and an arrangement of patch panel modules 956 shown in FIG. 4, also respectively. In some cases, server racks having these components or variations thereof may be configured to provide front-access to connections generally available on the rear of rack-mounted computing equipment, in some cases with off-the-shelf cabling having male-to-male SFP, SFP+, or QSFP+ connections. Further, some embodiments may mitigate wire-management problems presented by older designs.

The illustrated server rack 950 is a wedge-shaped server rack of the type included in the server racks described in the applications incorporated by reference. As illustrated, a front facing portion 958 is generally wider than a rear-facing portion 960. In this example, the server rack 950 may be designed such that substantially all, or all, maintenance is performed from the side of the front facing portion 958 once the rack 950 is assembled. For instance, technicians may be blocked by the rack from approaching from the side of the rear-facing portion 960. In some embodiments, an array of rack-mounted computing equipment may be vertically arranged within a volume 962 disposed between the front-facing portion 958 and the rear-facing portion 960. In some embodiments, each instance of computing equipment may reside on rails or a drawer that slides outward, past the front-facing portion 958 to provide access to the computing equipment.

In some embodiments, that computing equipment may include connectors disposed at various locations throughout the computing equipment, for instance, at various positions between the front and back, with at least some come connections being positioned at or near (e.g., within 10 centimeters of) the rear of the computing equipment in some embodiments. In some cases, wiring, such as networking cables, like SFP, SFP+, or QSFP+ cables may be routed from the rear of the computing equipment around a 180° bend and into one of an array of apertures 964 in the rear support structure 952. In some embodiments, the apertures 964 may be arrayed in a periodic, linear arrangement, for instance, with more than five, e.g., more than 10 holes in space relation, and the holes may provide passage from the rear to the front or vice versa. Or, in some cases, the holes may be facing left to right, or up and down. In some cases, edges of the holes may be structured to reduce wear on cables, for example, with a curved surface extending around the perimeter of the apertures 964 or grommets made from a resilient material, like rubber. The cables may extend between the rear support structure 952 and the front support structure 954, where a connector on the cables may connect to one of the patch panel modules 956 shown in FIG. 4.

In some embodiments, the rear and front support structures 952 and 954 may be made from stamped or extruded metal, like bent sheet-metal having an array of apertures cut therein, to reduce manufacturing costs. In some embodiments, the front support structure 954 may include an array of generally rectangular apertures 966, disposed in a linear periodic arrangement, extending vertically from a floor 968, to a ceiling 970 of the rack 950. Alternatively, or additionally, the support structures 952 and 954 may extend horizontally, for example, in three rows or five rows extending horizontally, with an instance of each generally being horizontally aligned at the front and back, and the instances in regular space arrangement from the floor 968 to the ceiling 970. In some embodiments, an instance of the support structures 952 and 954, and the related components, may be disposed both on a left and a right side of the interior volume 962. In some embodiments, the arrangement shown may be replicated on each of several vertical racks in a data center.

In some cases, the front support structure 954 is in front of the rear support structure 952, meaning that the structure closer to the side at which maintenance is performed. In some cases it is directly in front, or in other cases, it is offset to the left, right, above, or below, e.g., within 20 cm. In some cases, the support structures are separate components attached to the rack, or in some embodiments, the support structures are integrally formed with the rack. The support structures may carry the weight of the cables and the patch panels and hold these components in a spatially organized arrangement that provides ease of installation of maintenance.

Figure 4:
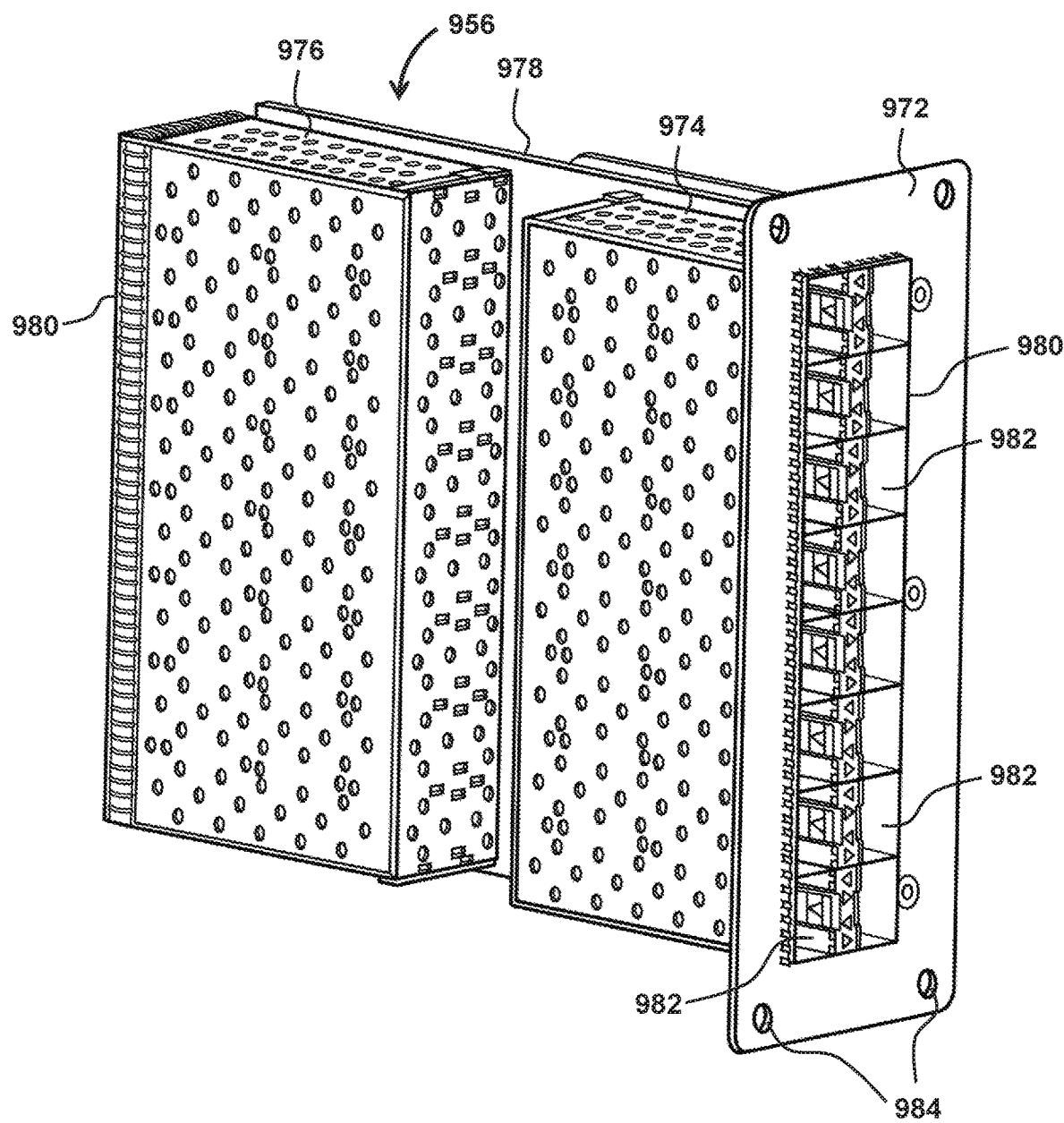
FIG. 4 is a patch panel module of the rack of FIG. 3.

FIG. 4 shows additional details of the patch panel modules 956 mentioned above. As discussed, one instance of the patch mount panel module 956 may be disposed in each of the apertures 966 in the front support member 954. In some embodiments, a faceplate 972 may face outward, in the same direction as the front-facing portion 958, and the body of the patch panel module 956 may be recessed behind the front-facing portion 958, through the respective aperture 966 in which the patch panel module 956 is disposed.

In some embodiments, each patch panel module may include a front cage 974, a rear cage 976, and a printed circuit board 978 connecting the front cage 974 to the rear cage 976, both mechanically and electrically. In some embodiments, the front cage 974 and the rear cage 976 may be oriented in opposite directions, with connector arrays 980 facing in opposite directions. In the illustrated embodiment, each connector array 980 includes two columns side-by-side each with eight female cable connectors 982, also referred to as sockets. In some embodiments, the female cable connectors 98 may receive a male cable connector and place that male cable connector in communication with another male cable connector plugged into the opposing female connector (not shown) on the opposite side of the patch panel module 956. Thus, in some cases, a male-to-male cable may connect the rear of computing equipment to a female connector 892 exposed in the front facing portion 958 of a rack 950, thereby providing front-side access to the connections of the computing equipment.

A variety of different types of connectors may be provided, including SFP, SFP+, QSFP+, USB, HDMI, VGA, RJ45, and the like. In some embodiments, an array of different types of connectors may be placed side-by-side, or in some embodiments, the entire array 980 of connectors may be the same. In some embodiments, the array of connectors 980 in the front cage 974 may be different from the array of connectors in the rear cage 976. For example, some embodiments may include a single QSFP+ connector in the rear cage 976 that connects to four different SFP+ connectors in the front cage 974, with different channels being routed to different ones of those connectors, or vice versa.

In some embodiments, the cages 974 and 976 include an arrangement of holes for cooling and are made from a conductive material, like steel, for electrical shielding. In some cases, the faceplate 972 may include four apertures 984 through which screws, bolts, rivets, or the like, are passed through corresponding holes in the front support structure 954 to hold the patch panel module 956 thereto.

In some embodiments, the circuit board 978 may include an array of vias into which pins connecting to wiring within the front cage 976 and the rear cage 974 are soldered or press fit, and those vias may be connected to one or more layers of electrically conductive traces patterned in the printed circuit board 978 to place the appropriate pins and electrical communication with one another. In other embodiments, other types of interconnects may be provided, including optical interconnects. In other embodiments, the rear cage may be oriented in a different direction or directions, e.g., upward, downward, left, or right, or split with subsets oriented in different ones of these directions.

The illustrated arrangement, in various embodiments, is expected to provide various advantages, particularly when rack-mounting computing equipment with rear connectors is used in racks designed for front access (though use cases are not limited to this arrangement, which is not to imply that any other feature is limiting in all cases). For example, some embodiments are expected to allow the rack to be assembled with all or substantially all of the rear wiring installed in the rack, such that when the rack is populated with servers, a relatively short cable connecting the rear to the front is all that remains to be connected to finish out the wiring. Further, embodiments are expected to allow rear-wired servers to be used in front access racks.

Moreover, the illustrated arrangement is expected to help with cable management by spatially arranging the cabling along the side of, or below and above, computing equipment. Such wiring can become relatively complex with many modern configurations. For example, some configurations may have eight servers per pair of rack U's, with two ports per server, which could lead to over 300 network connections in a single rack to be wired. The illustrated front-to back arrangement, with the array of apertures 964 and array of patch panel modules 956 is expected to keep these wires relatively organized and allow discrete access to subsets of the wires, without disturbing a full wiring configuration. Further, the front access is expected to be relatively serviceable and easy to reconfigure, as various wires are plugged into the front facing connectors 982 to interconnect various servers and other instances of computing equipment to one another and various networking equipment, like network switches, such as top-of-rack switches or in-rack switches.

Figure 5:
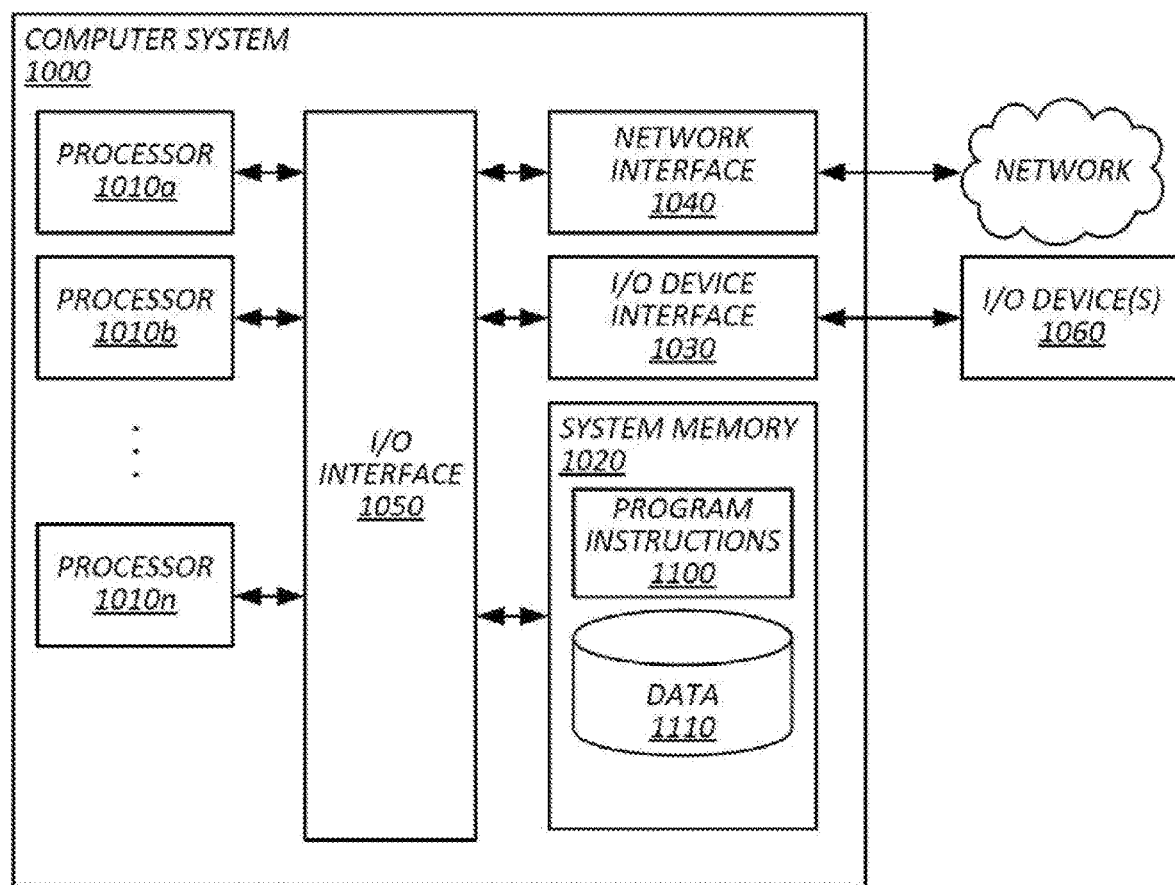
FIG. 5 illustrates components of a computing device in accordance with embodiments of the present technique.

FIG. 5 is a diagram that illustrates an exemplary computing system 1000 in accordance with embodiments of the present technique. In some cases, the above-described patch panels may connect a plurality of instances of system 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A method of extending a female SFP, SFP+, or QSFP+ connection on a computing device from a first location to a second, different location, comprising: receiving data via a male interface having a first SFP, SFP+, or QSFP+ transceiver; conveying the data more than 10 centimeters via a plurality of electrical conductors or one or more optical conductors, wherein the electrical or optical conductors mechanically and communicatively couple the first SFP, SFP+, or QSFP+ transceiver to a female interface having a second SFP, SFP+, or QSFP+ transceiver; mechanically coupling, with the female interface, to another male interface having a third SFP, SFP+, or QSFP+ transceiver; and conveying the data from the second SFP, SFP+, or QSFP+ transceiver to the third SFP, SFP+, or QSFP+ transceiver.

2. The method of embodiment 1, wherein conveying the data more than 10 centimeters comprises conveying the data from a rear of a rack of computing equipment to a front of the rack of computing equipment via a cable, the cable being a removable component that includes the male and female interface and is a discrete part by which computing equipment in the rack is connected to a network.

3. The method of embodiment 3, comprising reducing an impedance mismatch between the cable and the female interface, the male interface, or both, with termination circuitry.

4. The method of any of embodiments 1-3, comprising: mechanically protecting the female interface, the male interface, or both with an overmolded material; and conveying the data through a 90-degree bend in a signal path.

5. The method of any of embodiments 1-4, comprising: mechanically supporting a computing device coupled to the male interface with a 19-inch rack-size adapter, wherein a cable connecting the male interface to the female interface is routed from a rear of the adapter to a front of the adapter.

6. The method of any of embodiments 1-5, comprising: transparently extending a female SFP, SFP+, or QSFP+ connector on a computing device from a first location to a second location more than 20 centimeters away from the first location.

7. The method of embodiment 6, wherein transparently extending a female SFP, SFP+, or QSFP+ connector on a computing device is an passive electrical extension.

8. The method of embodiment 6, wherein transparently extending a female SFP, SFP+, or QSFP+ connector on a computing device is performed with active circuitry.

9. The method of any of embodiments 1-8, wherein the conveying the data more than 10 centimeters comprises conveying the data via electrical conductors, the method comprising shielding the electrical conductors by at least partially enveloping the electrical conductors in a conductive casing.

10. An apparatus, comprising: a patch panel, comprising: circuit board; and an SFP, SFP+, or QSFP+ connector coupled to a plurality of radio frequency coaxial (RF coaxial) connections via conductive traces of the circuit board, the RF coaxial connections configured to extend functionality of the SFP, SFP+, or QSFP+ socket of a computing device coupled to the patch panel from a rear end of the computing device to a front end of the computing device.

11. The apparatus of embodiment 10, the patch panel further comprising: one or more microcontrollers coupled to at least two of the conductive traces, wherein the one or more microcontrollers comprise memory storing instructions that when executed cause the one or more microcontrollers to perform operations comprising: obtaining configuration settings for SFP, SFP+, or QSFP+ connector; and configuring connections of the SFP, SFP+, or QSFP+ connector based on the configuration settings.

12. The apparatus of any of embodiments 10-11, the patch panel further comprising a fiber optic transceiver.

13. The apparatus of any of embodiments 10-12, wherein the patch panel has a first end and a second end opposite to the first end, and wherein the SFP, SFP+, or QSFP+ connector is located towards the first end and wherein the RF coaxial connections are located towards the second end.

14. The apparatus of embodiment 13, wherein the RF coaxial connections include four coaxial cable connectors, and wherein two coaxial cable connectors are positioned on the circuit board towards the second end and two coaxial cable connectors are positioned perpendicularly on the board towards a middle of the patch panel.

15. The patch panel of any of embodiments 10-14, wherein the SFP, SFP+, or QSFP+ connector is enclosed in a housing configured to fit on an SFP, SFP+, or QSFP+ cable head.

16. The apparatus of any of embodiments 10-15, the patch panel further comprising a plurality of coaxial shielded cables configured to carry signals from one side of the computing device to an opposite side of the computing device.

17. The apparatus any of embodiments 10-16, comprising a processor configured to perform operations comprising: obtaining a first configuration setting; and configuring at least one QSFP+ socket for a 1 by 40 gigabit per second connection based on the first configuration setting.

18. The apparatus of any of embodiments 10-17, the patch panel further a comprising a transceiver, and a processor configured to perform operations comprising: reading identifiers of the transceiver from a memory of the transceiver and sending data indicating connections status based on the identifiers; and detecting a fault indicating a failure of a component and, in response, sending a message to a rack controller indicating a location of the failed component.

19. The apparatus any of embodiments 10-18, comprising: a computing device coupled to the patch panel; a plurality of shield cables coupled to the RF coaxial connections; an SFP, SFP+, or QSFP+ socket coupled to the RF coaxial connections; and an adapter for rack-mounted computing equipment, the adapter comprising: a chassis; a channel extending at least half a distance along the chassis in a front-to-back direction, the channel defining a volume configured to hold the shield cables extending from a back side of the chassis to a front side of the chassis.

20. The apparatus of any of embodiments 10-19, comprising: data center comprising a plurality of racks, the racks having computing devices coupled to a plurality of the patch panels.

21. A computing-equipment rack, comprising: a front support structure: a rear support structure disposed behind the front support structure; a patch panel module coupled to the front support structure and comprising: a first plurality of sockets facing forward; and a second plurality of sockets facing in a different direction from forward, wherein the patch panel module is supported by the front support structure.

22. The rack of embodiment 21, comprising: an array of receptacles for computing equipment extending in a first direction orthogonal to a front-to-back direction.

23. The rack of any of embodiments 21-22, wherein the patch panel module comprises: more than four SFP, SFP+, or QSFP+ sockets facing forward; and more than four SFP, SFP+, or QSFP+ sockets facing backward.

24. The rack of any of embodiments 21-22, wherein the patch panel module comprises:
    a QSFP+ socket on one side communicatively coupled to four SFP+ sockets on another side.

25. The rack of any of embodiments 21-22, wherein the front and rear support extend vertically, along a side of a rack, and wherein the front support holds a plurality of patch panel modules.

26. The rack of any of embodiments 21-22, wherein the front and rear support extend horizontally between rows of rack mounted computing equipment.

27. The rack of any of embodiments 21-22, comprising:
a rack to which the front support and the rear support are secured;
a plurality of rows of computing equipment disposed in the rack;
a first set of cables connecting from SFP, SFP+, or QSFP+ connectors on the rear of at least some of the computing equipment to the second plurality of sockets; and
a second set of cables connecting between SFP, SFP+, or QSFP+ sockets in the first plurality of sockets in one or more patch panel modules on the front of the rack coupled to the front support structure.

28. The rack of any of embodiments 21-22, wherein the sockets include at least three sockets selected from among: SFP, SFP+, QSFP+, USB, VGA, HDMI, and RJ45 sockets.

What is claimed is:

1. A method of extending a SFP-type connection on a computing device from a first location to a second, different location, the method comprising:
receiving data, via a first interface having a first SFP-type transceiver;
transmitting the data via an optical fiber to a second interface having a second SFP-type transceiver, wherein transmitting the data includes transmitting the data from a first location to a second, different location, wherein the first SFP-type transceiver transmits the data to the second SFP-type transceiver as an optical signal via the optical fiber, after converting an electrical signal received from computing equipment to the optical signal;
transmitting the data from the second SFP-type transceiver to another interface having a third SFP-type transceiver connected to the second interface;
sensing, with the first SFP-type transceiver, analog data indicative of operation of the first SFP-type transceiver;
converting, with the first SFP-type transceiver, analog data indicative of operation of the first SFP-type transceiver to digital data; and
storing the digital data in a memory register associated with the first SFP-type transceiver, wherein the memory register is part of a set of memory registers that store at least one of the following: an alarm threshold, warning thresholds, calibration constants, diagnostic values, password values, control function codes, an optical output power, optical input power, temperature, laser bias current, or supply voltage associated with the first SFP-type transceiver.

2. The method of claim 1, wherein the first SFP-type transceiver is a SFP, SFP+, or QSFP+ transceiver.

3. The method of claim 1, wherein the optical fiber is a fiber optic cable, and wherein conveying the data via the cable includes conveying the data between the first SFP-type transceiver and the second SFP-type transceiver using a plurality of channels of the fiber optic cable.

4. The method of claim 1, wherein the first SFP-type transceiver further includes:
a digital diagnostics monitoring interface to monitor at least three of the following: an optical output power, optical input power, temperature, laser bias current, or supply voltage associated with the first SFP-type transceiver.

5. The method of claim 1 further comprising:
configuring the first SFP-type transceiver using a microcontroller associated with, and mechanically coupled to, the first SFP-type transceiver, wherein the configuring includes configuring the first SFP-type transceiver in response to receiving a remote command over a network.

6. The method of claim 1 further comprising:
reading, using a microcontroller collocated on a circuit board with the first SFP-type transceiver, a plurality of operating parameters of the first SFP-type transceiver;
determining, using the microcontroller, a first operating parameter of the plurality of operating parameters is outside of a threshold range; and
sending, using the microcontroller, in response to the determination, an alert to a rack controller.

7. The method of claim 1 further comprising:
reducing an impedance mismatch with the second SFP-type transceiver with termination circuitry.

8. The method of claim 1, wherein transmitting the data includes:
transparently extending a SFP-type connector on computing equipment from a first location to a second location more than 20 centimeters away from the first location.

9. The method of claim 8, wherein of transparently extending the SFP-type connector on the computing equipment includes transparently extending the SFP-type connection with a passive extension.

10. The method of claim 8, wherein transparently extending the SFP-type connector on the computing equipment includes transparently extending the SFP-type connector with active circuitry.

11. An apparatus, comprising:
a patch panel, the patch panel including a first SFP-type connector, wherein the patch panel is configured to electrically couple with a computing device by coupling the first SFP-type connector to a first SFP-type socket of the computing device, the first SFP-type connector being a QSFP-or-faster connector; and
a second SFP-type socket coupled to the patch panel via radio frequency coaxial (RF coaxial) connections on the patch panel, wherein the second SFP-type socket is configured to extend functionality of the first SFP-type socket of the computing device from a rear of the computing device to a front of the computing device, wherein the patch panel relays signals from the computing device to a second SFP-type connector connected to the second SFP-type socket, wherein the patch panel further comprises:
a microcontroller configured to:
obtain configuration settings for the first SFP-type connector; and
configure connections of the first SFP-type connector based on the configuration settings; and
a transceiver connected to the first SFP-type connector, wherein the microcontroller is configured to perform operations including:
reading identifiers of a transceiver from a memory of the transceiver and sending data indicating connection status that is on a cable head of the first SFP-type connector based on the identifiers, detecting a fault indicating a failure of a component and, in response, sending a message to a rack controller indicating a location of the failed component;

reading a plurality of operating parameters of the transceiver from memory of the transceiver after sensing and digitizing analog values upon which the plurality of operating parameters are based, determining a first operating parameter of the plurality of operating parameters is outside of a threshold range, and sending an alert to the rack controller indicative of the first operating parameter being outside of the threshold range.

12. The apparatus of claim 11, wherein the first SFP-type connector is a QSFP+ connector.

13. The apparatus of claim 11, wherein the patch panel further comprises:

a circuit board, wherein the circuit board relays signals from the first SFP-type connector to the radio frequency (RF) coaxial connections via conductive traces, and is configured to be powered by power provided from the first SFP-type connector, wherein the patch panel has a first end and a second end opposite the first end, wherein the first SFP-type connector is located towards the first end, and wherein the RF coaxial connections are located towards the second end.

14. The apparatus of claim 11, wherein the first end is narrower than the second end.

15. The apparatus of claim 11, wherein the second SFP-type socket is coupled to the patch panel using a plurality of cables that provides passive impedance balancing to carry signals from one side of the computing device to an opposite side of the computing device.

16. The apparatus of claim 11, wherein the patch panel further comprises:

means for monitoring of one or more parameters, the one or more parameters including input power, output power, temperature, laser bias current, or supply voltage, and means for converting analog data indicative of operational parameters to digital data, and storing the digital data in a memory associated with a transceiver.

17. The apparatus of claim 11 further comprising:

a computing-equipment rack having:
 a front support structure facing forward;
 a rear support structure disposed behind the front support structure; and
 a patch panel module including:
  a first plurality of sockets facing forward, and
  a second plurality of sockets facing backward, wherein the patch panel module is supported by the front support structure,
 wherein:
  the patch panel module is configured to extend a functionality of a SFP-type socket of a computing equipment from a rear end of the computing equipment to a first socket of the first plurality of sockets facing forward via a first cable connecting from the SFP-type socket on the rear of the computing equipment to one of the second plurality of sockets that corresponds to the first socket facing forward, and the patch panel module is configured to transmit data from the computing equipment to a computer network via a second cable connecting the first socket with SFP-type sockets in the first plurality of sockets in one or more patch panel modules coupled to the front support structure, and wherein the computing-equipment is disposed in the computing-equipment rack.

18. The apparatus of claim 11 further comprising:
the computing device, wherein the computing device has memory storing software thereon.

19. The apparatus of claim 11 further comprising:
means for producing a digital signal in an electrical domain from an incoming optical signal; and
means for clock recovery from data.

20. The apparatus of claim 11, wherein:
the patch panel is configured to be powered via a direct current (DC) power bus that also places the patch panel in communication with a rack controller.

21. The apparatus of claim 11 further comprising:
means for providing data indicative of configuration, alarms, and sensor states to other computing devices.

22. The apparatus of claim 11 further comprising:
means for providing data indicative of configuration, alarms, sensor states to other computing devices via an embedded network interface.

23. The apparatus of claim 11 further comprising:
means for connection, installation, and cable management.

24. The method of claim 1, wherein:
the first interface, the optical fiber, and the second interface have a bandwidth of at least 100 Gigabits per second.

25. The method of claim 1 further comprising:
adapting the first interface to a plurality of breakout cables, including the cable, each breakout cable conveying a subset of a bandwidth of the first interface, each breakout cable connecting to a different interface among a plurality of interfaces including the second interface.

26. The method of claim 1, wherein the set of memory registers store at least four of the following: an alarm threshold, warning thresholds, calibration constants, diagnostic values, password values, control function codes, an optical output power, optical input power, temperature, laser bias current, or supply voltage associated with the first SFP-type transceiver.

27. The method of claim 1, comprising:
hosting software on a computing device coupled to the first interface or the second interface.

28. A method of extending a SFP-type connection on a computing device from a first location to a second, different location, the method comprising:

receiving data, via a first interface having a first SFP-type transceiver;

transmitting the data via an optical fiber to a second interface having a second SFP-type transceiver, wherein transmitting the data includes transmitting the data from a first location to a second, different location, wherein the first SFP-type transceiver transmits the data to the second SFP-type transceiver as an optical signal via the optical fiber after converting an electrical signal received from computing equipment to the optical signal;

transmitting the data from the second SFP-type transceiver to another interface having a third SFP-type transceiver connected to the second interface;

reading, using a microcontroller associated with the first SFP-type transceiver, a plurality of operating parameters of the first SFP-type transceiver after sensing and digitizing analog values upon which the plurality of operating parameters are based;

determining, using the microcontroller, a first operating parameter of the plurality of operating parameters is outside of a threshold range; and sending, using the microcontroller, in response to the determination, an alert to a rack controller.

* * * * *